United States Patent
Atanakovic

(10) Patent No.: US 7,646,066 B2
(45) Date of Patent: Jan. 12, 2010

(54) DOUBLE GATE FET AND FABRICATION PROCESS

(75) Inventor: Petar B. Atanakovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 17 days.

(21) Appl. No.: 12/046,139

(22) Filed: Mar. 11, 2008

(65) Prior Publication Data
US 2008/0150031 A1 Jun. 26, 2008

Related U.S. Application Data

(62) Division of application No. 11/084,486, filed on Mar. 18, 2005, now Pat. No. 7,364,974.

(51) Int. Cl.
*H01L 21/20* (2006.01)
(52) U.S. Cl. .......................... 257/366; 257/365; 257/18; 257/22; 257/347; 257/410; 257/412; 257/E29.264
(58) Field of Classification Search ................ 257/366, 257/365, 18, 22, 347, 410, 412, E29.264
See application file for complete search history.

(56) References Cited

U.S. PATENT DOCUMENTS

| | | | |
|---|---|---|---|
| 2001/0010380 A1* | 8/2001 | Maeda | 257/365 |
| 2004/0094758 A1* | 5/2004 | Usuda et al. | 257/18 |
| 2004/0197969 A1* | 10/2004 | Chen et al. | 438/161 |

* cited by examiner

*Primary Examiner*—Marcos D. Pizarro
*Assistant Examiner*—Eva Y. Montalvo
(74) *Attorney, Agent, or Firm*—Parsons & Goltry; Robert A. Parsons; Michael W. Goltry

(57) ABSTRACT

A method of fabricating a double gate FET on a silicon substrate includes the steps of sequentially epitaxially growing a lower gate layer of crystalline rare earth silicide material on the substrate, a lower gate insulating layer of crystalline rare earth insulating material, an active layer of crystalline semiconductor material, an upper gate insulating layer of crystalline rare earth insulating material, and an upper gate layer of crystalline rare earth conductive material. The upper gate layer and the upper gate electrically insulating layer are etched and a contact is deposited on the upper gate layer to define an upper gate structure. An impurity is implanted into the lower gate layer to define a lower gate area aligned with the upper gate structure. A source and drain are formed in the active layer and contacts are deposited on the source and drain, respectively.

8 Claims, 4 Drawing Sheets

DOUBLE GATE FET AND FABRICATION PROCESS

CROSS-REFERENCE TO RELATED APPLICATIONS

This application is a divisional application of currently pending U.S. application Ser. No. 11/084,486, filed 18 Mar. 2005.

FIELD OF THE INVENTION

This invention relates to field effect transistors, and especially to field effect transistors with double gate structures, and to the fabrication process.

BACKGROUND OF THE INVENTION

Complimentary metal oxide semiconductor (CMOS) structures are the core active elements of modern electronics. Undoubtedly, the major material enabling features of Si CMOS are the superb quality of the native silicon dioxide ($SiO_2$), $Si/SiO_2$ interface and high crystalline perfection of the Si substrates. The field effect transistor (FET) implemented as CMOS is scalable. That is, speed and complexity improves with decreasing device feature sizes. This concept makes CMOS architecture a powerful methodology. Deep submicron room-temperature bulk Si CMOS is presently the main technology used for ultra large scale integrated circuits (ULSICs).

Because silicon is the major semiconductor material used in the semiconductor industry, silicon dioxide ($SiO_2$) is the major insulating material used in the gate insulating layer. Silicon dioxide is a natural material that can be easily grown thermally through a steam process. Also, the silicon dioxide forms a bond with the crystalline silicon active layer that determines most of the characteristics of the FET so that it is very difficult to change the insulating material of the gate insulating layer without having deleterious effects on the FET.

However, several problems do arise from the use of silicon dioxide as the gate insulating layer. Continued scaling of current CMOS architecture is reaching the limits of the material properties of both the $SiO_2$ gate dielectric and bulk Si substrate. As the length and thickness of the gate insulating layer is made smaller, defects and other materials in the gate insulating layer greatly affect the reliability, lifetime, and operating characteristics of the FET. For example, any impurities in the gate stack, such as the dopant material used in doping of layers of the gate stack, can cause serious problems. The impurities or doping materials are a problem because they migrate into the gate insulating layer and sometimes even into the active layer to produce defects and changes in operating characteristics.

One potential solution to the scaling of field effect transistors is the use of a second, buried gate below the active channel. It has been shown that the double gate structure reduces short channel effects and parasitic capacitance in field effect transistors so that they can be scaled further (i.e. thinner and shorter channels) than bulk-Si. In general, however, prior art suggestions for fabricating double gate FETs are extremely complicated, expensive, and very difficult to implement. Some of the prior art suggestions include forming the double gate FET in a vertical orientation with the gates on either side of a channel and the source and drain at the ends. This structure is extremely difficult to integrate into present semiconductor manufacturing techniques. Another structure is formed by removing material above and below the channel leaving a bridge structure and then filling the voids with electrically conductive gate material. This method is extremely complicated and difficult to consistently produce workable devices with constant characteristics.

Clearly, one of the major problems that arises in prior art attempts to fabricate planar double gate FETs is the buried conductive layer that ultimately forms the lower gate. In the semiconductor industry, forming a good conducting layer below, for example, crystalline or single crystal silicon is virtually unknown. One of the most common conductive buried layers includes heavily doped silicon areas, which is undesirable because free doping material has a tendency to migrate and corrupt other components, thereby shortening the life of the device and changing various characteristics (e.g. the threshold voltage). Also, heavily doped areas do not have good conductivity, thereby producing poor gate material.

An additional problem that arises in prior art planar structures is alignment of the upper and lower gates. It is well known that misaligned gates cause serious degradation in the performance of the device. In the prior art some attempts to minimize misalignment effects include oversized bottom gates and minimum sized bottom gates. In each case the results are poorer than properly aligned upper and lower gates.

It would be highly advantageous, therefore, to remedy the foregoing and other deficiencies inherent in the prior art.

Accordingly, it is an object of the present invention to provide a new and improved method of fabricating double gate field effect transistors and the new and improved double gate structure field effect transistors.

Another object of the invention is to provide a new and improved method of fabricating double gate structure field effect transistors to improve manufacturing consistency, to simplify the fabrication process, and to provide double gate field effect transistors with improved reliability, lifetime, and operating characteristics.

A further object of the present invention is to provide a new and improved buried conductive layer and fabrication process for use in field effect transistors that can be easily integrated into present day semiconductor manufacturing processes.

SUMMARY OF THE INVENTION

Briefly, to achieve the desired objects of the instant invention in accordance with a preferred embodiment thereof, provided is a method of fabricating a buried conductive layer for semiconductor components including the steps of providing a single crystal semiconductor substrate, epitaxially growing an electrically conductive layer of single crystal rare earth silicide material on the semiconductor substrate, and epitaxially growing a layer of single crystal rare earth insulating material on the single crystal semiconductor material to form a buried conductive layer. The buried conductive layer can conveniently be used in a variety of semiconductor components including, for example, a double gate field effect transistor.

To further achieve desired objects of the instant invention in accordance with a preferred embodiment thereof, provided is a method of fabricating a double gate field effect transistor structure including the following steps performed in any convenient order. Providing a single crystal silicon substrate and epitaxially growing a lower gate layer of single crystal rare earth electrically conductive silicide material on the silicon substrate. A lower gate electrically insulating layer of single crystal rare earth electrically insulating material is epitaxially grown on the lower gate layer of single crystal rare earth electrically conductive silicide material. An active layer of single crystal semiconductor material is epitaxially grown on the lower gate layer of single crystal rare earth electrically insulating material. An upper gate insulating layer of single crystal rare earth electrically insulating material is epitaxially grown on the active layer of single crystal semiconductor material. An upper gate layer of single crystal rare earth electrically conductive material is epitaxially grown on the upper gate electrically insulating layer. The lower gate layer, the lower gate electrically insulating layer, the active layer, the upper gate insulating layer, and the upper gate layer can all be grown in-situ. That is, they can all be grown in a continuous operation without removing the substrate from the chamber. The upper gate layer and the upper gate electrically insulating layer are etched and a metal contact is deposited on the upper gate layer to define an upper gate structure. An impurity is implanted into the lower gate layer to define a lower gate area aligned with the upper gate structure. A source area and drain area are formed in the active layer and metal source and drain contacts are deposited on the source area and drain area, respectively.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
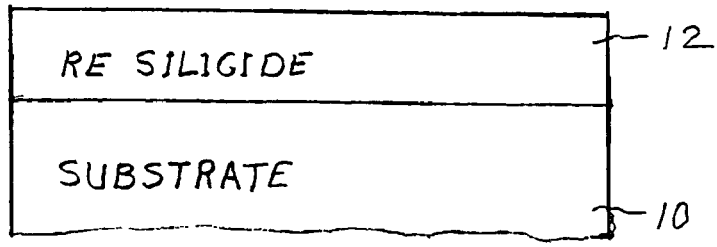
FIG. 1 is a simplified sectional view illustrating an initial step in a fabrication process for conductive buried layers in accordance with the present invention.

Turning now to the drawings, attention is first directed to FIG. 1, which illustrates a simplified sectional view illustrating an initial step in a fabrication process for improved conductive buried layers in accordance with the present invention. A substrate 10 is provided which, under normal manufacturing procedures, is a single crystal silicon wafer, although any size substrate, wafer, or portion of a wafer could be used in the following procedures, (all of which come within the term 'substrate' as used in this disclosure) if desired. Also, it will be understood by those skilled in the art that the terms 'single crystal' and 'crystalline' are interchangeable and may be used interchangeably in the present discussion.

A gate conductive layer 12 of single crystal rare earth silicide is formed directly on the surface of substrate 10 by any of a variety of methods. In a preferred embodiment, rare earth silicide layer 12 is epitaxially deposited or grown directly on the surface of substrate 10. Layer 12 can also be formed in a variety of other methods, only one of which is to deposit a layer of the rare earth on the surface of substrate 10 and then anneal the rare earth with the pure silicon to form a thin layer of rare earth silicide. It will be understood that rare earth suicides are essentially metal and are good electrical conductors.

While any of the materials known as 'rare earths' can be used, two preferred examples are Erbium (Er) and Ytterbium (Yb). Other typical examples of rare earth materials that can be used in this application are described in a copending United States patent application entitled "Rare Earth-Oxides, Rare Earth-Nitrides, Rare Earth-Phosphides and Ternary Alloys With Silicon", filed on Dec. 28, 2004, and bearing Ser. No. 11/025,680, which is a conversion of U.S. provisional application No. 60/533,378, filed 29 Dec. 2003 and bearing the same title, incorporated herein by reference. All of the conductive materials formed from any of the above described rare earths are referred to in this disclosure generally as "rare earth silicides" or as "rare earth conductive material".

Figure 2:
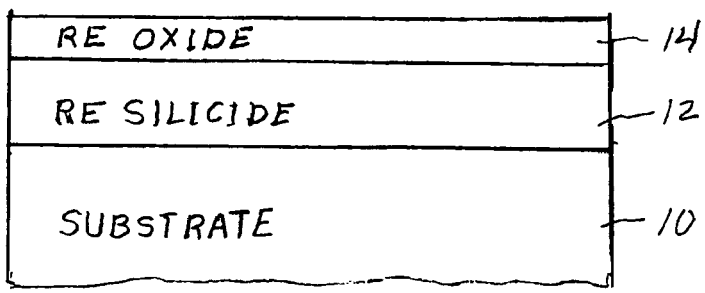
FIG. 2 is a simplified sectional view illustrating another step in the fabrication process for conductive buried layers of FIG. 1.

Referring additionally to FIG. 2, a thin single crystal layer 14 of rare earth insulating material (rare earth oxide, nitride, oxynitride, etc.) is epitaxially grown on the surface of rare earth silicide layer 12. Because layer 12 is a single crystal material, layer 14 of rare earth insulating material can be epitaxially grown directly thereon as a single crystal material and can be closely lattice matched thereto. All of the above described rare earth materials formed as single crystal electrically insulating material (e.g. rare earth oxide, rare earth nitride, rare earth oxynitride, etc.) are referred to in this disclosure generally as "rare earth electrical insulators" or as "rare earth electrically insulating materials".

Figure 3:
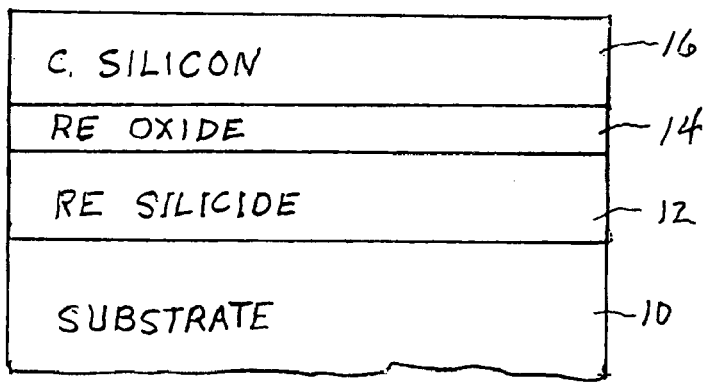
FIG. 3 is a simplified sectional view illustrating an intermediate step in a fabrication process for double gate field effect transistors using the conductive buried layer of FIG. 2, in accordance with the present invention.

It will be noted by those skilled in the art that at this point rare earth silicide layer 12 is a buried conductive layer and the structure can be used for a variety of different applications. In this embodiment, rare earth insulating material layer 14 is provided as a lower gate electrically insulating layer and is generally grown a few nanometers (e.g. 10 nm or less) thick. Referring additionally to FIG. 3, a layer 16 of single crystal silicon is grown directly on and lattice matched to rare earth insulating material layer 14. Because layer 14 is single crystal material and can be closely lattice matched to single crystal silicon, layer 16 can be epitaxially grown directly, in-situ if desired. Layer 16 will be the channel or active layer of the field effect transistor being fabricated and, therefore, will be grown relatively thin (e.g. in a range of 50 Å to 500 Å thick). Further, because active layer 16 is grown epitaxially, the thickness and uniformity, as well as the purity, can be closely controlled.

Figure 4:
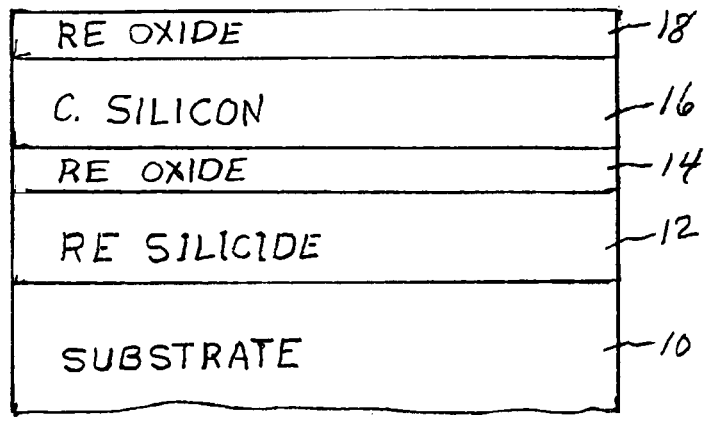
FIGS. 4 and 5 illustrate additional optionally in-situ growth steps in the double gate field effect transistor fabrication process of FIG. 3.

Turning now to FIG. 4, a second thin single crystal gate electrically insulating layer 18 of rare earth insulating material is epitaxially grown on active layer 16. Because gate insulating layer 18 is again fabricated of single crystal material, it can be relatively closely lattice matched to active layer 16 and can be epitaxially grown with the thickness and uniformity, as well as the purity, closely controlled. Further, insulating layer 18 can be grown in-situ if desired. In this embodiment, insulating layer 18 is grown as the upper gate insulator and, therefore, will be grown relatively thin (e.g. in a range of 50 Å to 500 Å thick). Generally, insulating layer 18 will be grown to substantially match lower gate insulating layer 14 so that symmetric gates are formed. However, other embodiments (e.g. non-symmetrical gates) can be devised if desired.

Figure 5:
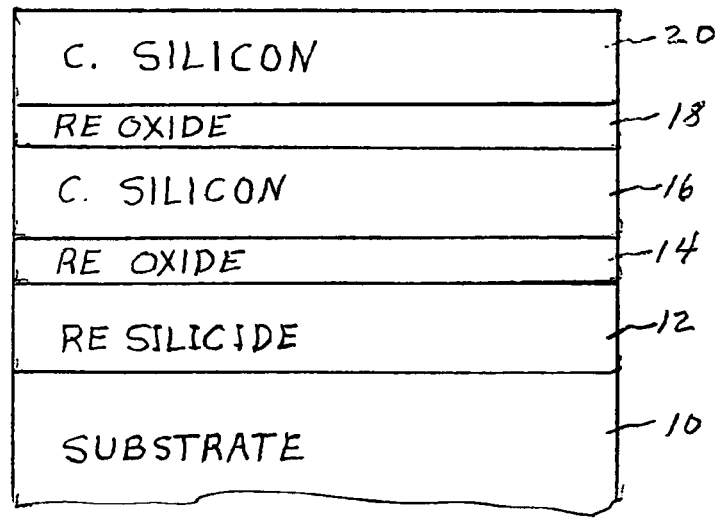

One or more layers, represented by a single crystal silicon layer 20 in FIG. 5, for the formation of an upper gate stack can be deposited on insulating layer 18. Single crystal silicon layer 20 can be doped in any desirable process including, for example, incorporating the dopant at the time of deposit or implanting a dopant later, with boron or any other selected dopant to provide the desired conductivity. Because layer 20 is single crystal silicon, migration of the dopant material within layer 20 or out of layer 20 and into layer 18 is prevented. That is, boron atoms residing in the single crystal structure will tie into the crystal bonds and, thus, be a part of the crystalline structure and not be free to move. Also, the rare earth insulator of layer 18 prevents migration of dopant materials or other impurities into layer 18 or through layer 18 and into active layer 16. A more thorough explanation of the improved gate stack and gate structure is contained in a copending U.S. patent application entitled "FET Gate Structure and Fabrication Process", filed February 2005, bearing Ser. No. 11/068,222, and incorporated herein by reference.

Figure 6:
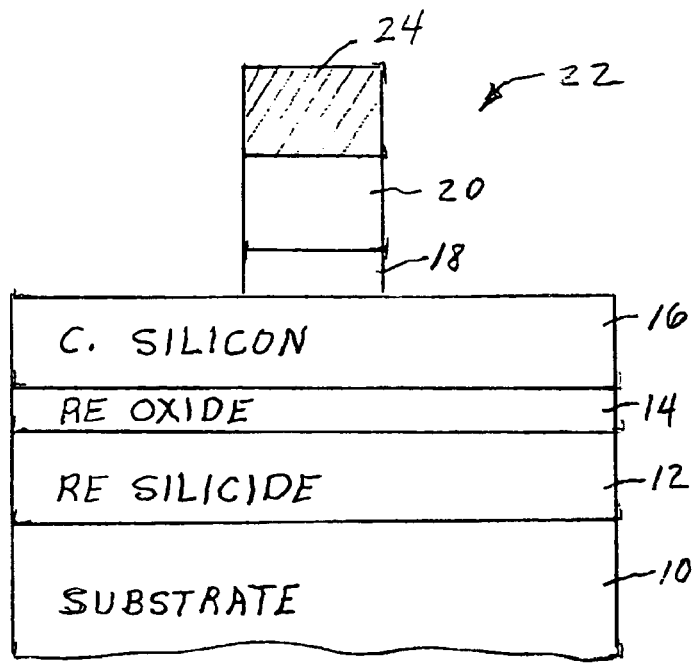
FIGS. 6 through 9 illustrate additional steps in the double gate field effect transistor fabrication process, after the growth steps.

Referring additionally to FIG. 6, the structure on substrate 10 can be patterned and etched to define upper gate structure 22 and then metalized to form electrical contact 24. Alternatively, the structure on substrate 10 can be patterned and metalized and then etched using the metallization as a pattern. Other fabrication variations can be devised but the result is upper gate structure 22 including gate insulating layer 18, gate stack 20, and gate metal contact 24 as illustrated. In this configuration, single crystal rare earth insulating layer 18 is a very good gate insulator and lattice matches with silicon active layer 16 to improve operating characteristics and to reduce stresses. Also, because insulating layer 18 is single crystal, gate stack 20 of single crystal silicon can be epitaxially grown. Because gate stack 20 is single crystal silicon any impurities or dopant materials introduced to provide the desired conductivity will generally be firmly tied into the crystalline structure and will not migrate into the gate insulator. Also, any loose or free impurities have a strong tendency not to migrate in the single crystal structure.

Figure 7:
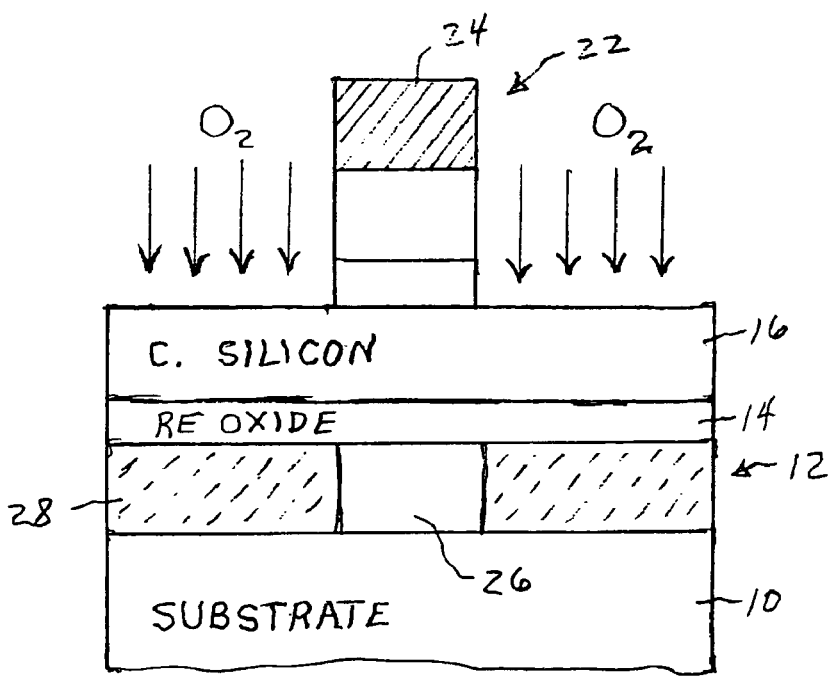

Once upper gate structure 22 is formed, as illustrated in FIG. 6, it can be used as a hard mask to define a lower gate, designated 26 in FIG. 7. Using upper gate structure 22 as an implant mask, an impurity or dopant, such as oxygen molecules ($O_2$), is implanted into rare earth silicide layer 12 to define a gate area 26 within an implanted area 28. The implanted oxygen breaks up the crystalline structure so that it is converted to an electrically non-conductive material and the gate is defined by the remaining electrically conductive rare earth silicide area 26. Since upper gate structure 22 is used as a mask, lower gate area 26 is accurately aligned with the upper gate structure 22. It will be understood that a convenient via or other electrical connection (not shown) can be provided to lower gate area 26 so that a desired bias or signal can be applied. Generally, in symmetrical gate devices the upper and lower gates are electrically connected to the same potential source.

Figure 8:
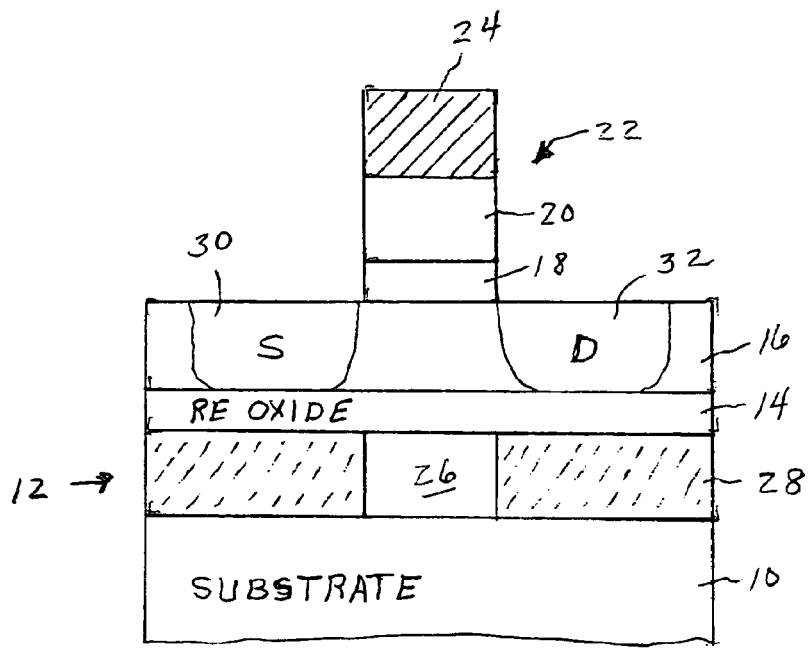

A semiconductor component, such as a FET, can be completed in active layer 16 by simply forming a source and a drain in some convenient process, as illustrated in FIG. 8. For example, a source 30 and a drain 32 can be formed by diffusion or implanting of a selected dopant material into the areas at either side of upper gate structure 22. Because of the novel process and construction of upper gate structure 22 and lower gate area 26, source 30 and gate 32 can be formed near the end of the FET fabrication process rather than as an initial step. Also, a thickness of active layer 16 can be selected so that a fully depleted FET is formed or a partially depleted FET can be formed with rare earth oxide layer 14 acting as an insulating layer in an SOI structure. Thus, it will be understood by those skilled in the art, that the process for fabricating FETs and other semiconductor components has been substantially improved and simplified.

Figure 9:
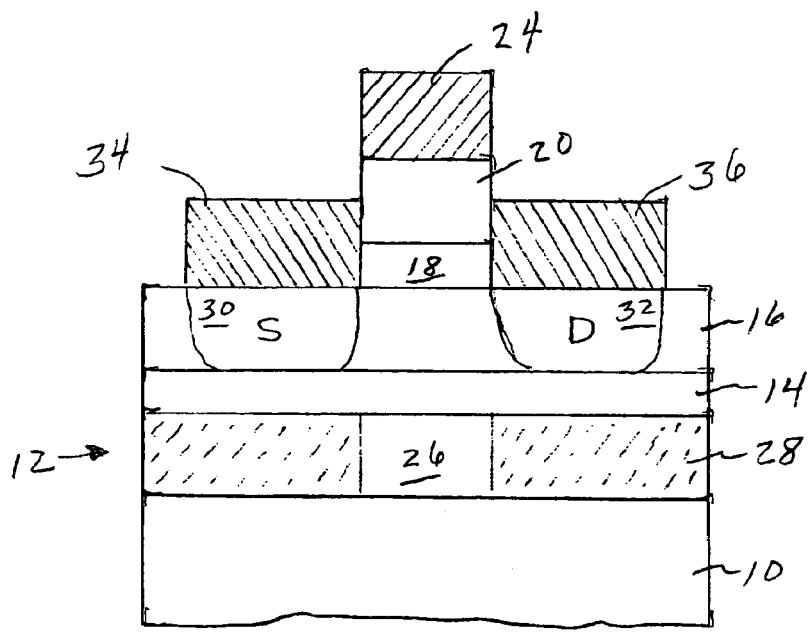

As a final step, referring specifically to FIG. 9, a metallization process (e.g. cleaning, masking, metal deposit, and liftoff) is performed to form a metal source contact 34 on source area 30 and a metal drain contact 36 on drain area 32. At the same time, a contact to lower gate 26 can be provided, as well as connections to other components in the circuit, as is well known.

Thus, a new and improved method of fabricating buried conductive layers for use in semiconductor components has been disclosed. Also, new and improved semiconductor components including new and improved double gate structures have been disclosed. Because of the improved insulating characteristics of rare earth insulating materials and because of the ability to control various characteristics of each layer in a semiconductor component (e.g. thickness and high K dielectric gate oxides) further scaling or reduction in size of CMOS architecture is possible. Also, because of the single crystal rare earth insulators utilized as the lower and upper gate insulating layers, migration of dopant materials is eliminated and transistor characteristics are standardized over entire wafers to improve operating characteristics and life. Further, the steps in fabricating processes for double gate FETs and the like can be substantially simplified by the simplified process for forming buried conductive layers and the process for forming components, such as the source and drain areas at a later step in the process.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

The invention claimed is:

1. A double gate field effect transistor structure comprising:
    a single crystal silicon substrate;
    a lower gate layer of single crystal rare earth electrically conductive silicide material positioned on the silicon substrate;
    a lower gate electrically insulating layer of single crystal rare earth electrically insulating material positioned on the lower gate layer of single crystal rare earth electrically conductive silicide material;
    an active layer of single crystal semiconductor material positioned on the lower gate layer of single crystal rare earth electrically insulating material;
    an upper gate insulating layer of single crystal rare earth electrically insulating material positioned on the active layer of single crystal semiconductor material;
    an upper gate layer of single crystal rare earth electrically conductive material positioned on the upper gate electrically insulating layer;
    the upper gate layer and the upper gate electrically insulating layer being formed to define an upper gate structure and a metal contact positioned on the upper gate layer;
    an impurity introduced into the lower gate layer of single crystal rare earth electrically conductive silicide material so as to define a lower gate area aligned with the upper gate structure;
    a source area and drain area in the active layer; and
    metal source and drain contacts positioned on the source area and drain area, respectively.

2. A double gate field effect transistor structure as claimed in claim 1 wherein the electrically conductive layer of single crystal rare earth silicide material includes one of erbium and ytterbium as the rare earth.

3. A double gate field effect transistor structure as claimed in claim 1 wherein the active layer of single crystal semiconductor material includes growing an active layer of single crystal silicon material.

4. A double gate field effect transistor structure as claimed in claim 1 wherein the lower gate electrically insulating layer has a thickness of 10 nm or less.

5. A double gate field effect transistor structure as claimed in claim 1 wherein the upper gate electrically insulating layer has a thickness of 10 nm or less.

6. A double gate field effect transistor structure as claimed in claim 1 wherein the impurity includes oxygen.

7. A double gate field effect transistor structure as claimed in claim 1 further including an electrically conductive via coupled to the lower gate area.

8. A double gate field effect transistor structure as claimed in claim 1 wherein each of the lower gate layer, the lower gate electrically insulating layer, the active layer, the upper gate electrically insulating layer, and the upper gate layer are substantially lattice matched to the single crystal silicon substrate, the lower gate layer, the lower gate electrically insulating layer, the active layer, and the upper gate electrically insulating layer, respectively.

* * * * *